United States Patent
Guidry

(10) Patent No.: US 11,152,901 B2
(45) Date of Patent: Oct. 19, 2021

(54) AMPLIFIER

(71) Applicant: Analog Devices, Inc., Norwood, MA (US)

(72) Inventor: Michael J. Guidry, Merrimack, NH (US)

(73) Assignee: Analog Devices, Inc., Norwood, MA (US)

( * ) Notice: Subject to any disclaimer, the term of this patent is extended or adjusted under 35 U.S.C. 154(b) by 131 days.

(21) Appl. No.: 16/562,283

(22) Filed: Sep. 5, 2019

(65) Prior Publication Data

US 2020/0083852 A1 Mar. 12, 2020

Related U.S. Application Data

(60) Provisional application No. 62/729,187, filed on Sep. 10, 2018.

(51) Int. Cl.
| | | |
|---|---|---|
| H03F 3/45 | (2006.01) | |
| G06Q 50/06 | (2012.01) | |
| G01R 19/25 | (2006.01) | |
| H03G 3/30 | (2006.01) | |

(52) U.S. Cl.
CPC ..... *H03F 3/45071* (2013.01); *G01R 19/2513* (2013.01); *G06Q 50/06* (2013.01); *H03G 3/30* (2013.01)

(58) Field of Classification Search
CPC ..... H03F 3/45; H03F 3/45071; H03F 3/45179
USPC .................................................. 330/257, 260
See application file for complete search history.

(56) References Cited

U.S. PATENT DOCUMENTS

| | | | |
|---|---|---|---|
| 6,118,340 A | 9/2000 | Koen | |
| 6,140,872 A | 10/2000 | Mceldowney | |
| 6,259,322 B1 | 7/2001 | Muza | |
| 6,356,152 B1 | 3/2002 | Jezdic et al. | |
| 6,559,720 B1 | 5/2003 | Huijsing et al. | |
| 6,573,784 B2 | 6/2003 | Gower et al. | |
| 6,714,079 B2 | 3/2004 | Dessard et al. | |
| 7,088,179 B2 * | 8/2006 | Gilbert | H03F 1/26 330/254 |
| 7,202,738 B1 | 4/2007 | Huijsing et al. | |

(Continued)

FOREIGN PATENT DOCUMENTS

| | | |
|---|---|---|
| CN | 104320096 | 4/2017 |
| CN | 110890867 | 3/2020 |
| JP | 2008295060 | 12/2008 |
| KR | 101535332 | 7/2015 |

OTHER PUBLICATIONS

"Chinese Application Serial No. 201910849877.0, Notification to Make Rectification mailed Oct. 31, 2019", w/o English Translation, 2 pgs.

(Continued)

*Primary Examiner* — Steven J Mottola
(74) *Attorney, Agent, or Firm* — Schwegman Lundberg & Woessner, P.A.

(57) ABSTRACT

An instrumentation amplifier including a pair of input amplifiers, each including an input transistor and a feedback current amplifier configured to amplify and feedback an error current from the input transistor. The arrangement can enable a current efficient solution where the amplifier can operate with very low input signals that are close to, or potentially below ground, without requiring a negative power supply voltage.

21 Claims, 9 Drawing Sheets

(56) References Cited

U.S. PATENT DOCUMENTS

| | | | |
|---|---|---|---|
| 7,592,870 | B2 | 9/2009 | Wang et al. |
| 7,898,339 | B2 | 3/2011 | Ikeda et al. |
| 8,319,553 | B1 | 11/2012 | Ivanov |
| 2005/0275453 | A1 | 12/2005 | Botker |
| 2014/0285257 | A1 | 9/2014 | Kim |
| 2014/0361833 | A1 | 12/2014 | Rey-losada et al. |
| 2019/0068146 | A1 | 2/2019 | Raman et al. |

OTHER PUBLICATIONS

"European Application Serial No. 19196188.7, Extended European Search Report dated Jan. 31, 2020", 11 pgs.

Wu, Rong, "A 20-b plus or minus 40-mV Range Read-Out IC With 50-nV Offset and 0.04 Percent Gain Error for Bridge Transducers", IEEE Journal of Solid-State Circuits, 47(9), (Sep. 2012), 2152-2163.

Kim, Jong Pal, "0.6 V, 116 nW Neural Spike Acquisition IC with Self-Biased Instrumentation Amplifier and Analog Spike Extraction", Sensors, 18(8), (2018), 13 pgs.

Shedge, Dyandeo K., "Chapter 3: Instrumentation Amplifier (IA) Background", in Performance Improvement in Signal Conditioning Circuitry for Bioimpedance Sensors using MOS Technology, PhD Thesis in the University of Pune, Maharashtra, India, [Online] Retrieved from the Internet: <URL: https://shodhganga.inflibnet.ac.in/handle/10603/84144>, (Aug. 2014), 12 pgs.

Yadav, Anuj Singh, "A High CMRR-CMOS Instrumentation Amplifier Intended for Bioimpedance Imaging", Ijirset, 5(7), (Jul. 2016), 8 pgs.

\* cited by examiner

AMPLIFIER

CLAIM OF PRIORITY

This application claims the benefit of priority of U.S. Provisional Application Ser. No. 62/729,187, titled "AN AMPLIFIER" to Michael J. Guidry, filed on Sep. 10, 2018, the entire contents of which being incorporated herein by reference.

BACKGROUND

Millions of utility electricity meters are deployed globally each year for calculating energy consumption of premises for billing, in addition to many sub-metering devices used for monitoring applications. These devices are typically calibrated at the factory prior to deployment, and then continuously measure consumption of electricity over their deployment lifetime, without interruption to the act of measurement. Annually a percentage of these meters are removed, re-tested for accuracy in labs, to estimate the accuracy distribution of the greater population in the field, to decide if complete removal of the population is needed, but the accuracy of each individual meter is largely unknown, and annually millions of perfectly accurate meters are replaced, while in instances inaccurate meters can be left operating in the field.

Utility meter accuracy monitoring systems may be implemented as part of a utility meter to help in determining and monitoring the accuracy of the meter. These systems typically include a number of different electronic circuits/modules, including one or more instrumentation amplifiers for amplifying signals before they are measured.

SUMMARY

The present disclosure relates to an instrumentation feedback amplifier. The instrumentation feedback amplifier comprises a pair of input amplifiers, each comprising an input transistor and a feedback current amplifier configured to amplify and feedback an error current from the input transistor. The arrangement may enable a current efficient solution where the amplifier can operate with very low input signals that are close to, or potentially below ground, without requiring a negative power supply voltage.

Whilst the instrumentation feedback amplifier is described in the context of utility meter accuracy monitoring, it will be appreciated that this is merely one example use of the instrumentation feedback amplifier. It may alternatively be used in any other context or system where amplification is required.

In a first aspect of the disclosure, there is provided an instrumentation amplifier comprising a first stage configured to generate an amplified differential output based on a differential input, the first stage comprising: a first amplifier comprising: a first MOS transistor, wherein a gate of the first MOS transistor is coupled to a first input of the differential input, and a first current amplifier coupling a drain of the first MOS transistor to a first output of the differential output; a second amplifier comprising: a second MOS transistor, wherein a gate of the second MOS transistor is coupled to a second input of the differential input, and a second current amplifier coupling a drain of the second MOS transistor to a second output of the differential output; and a resistor network comprising: a first feedback resistor coupling the first output to a source of the first MOS transistor; and a second feedback resistor coupling the second output to a source of the second MOS transistor.

The resistor network may further comprise a connecting resistor coupling the source of the first MOS transistor to the source of the second MOS transistor.

The first amplifier may further comprise a first voltage shift device configured to raise a body voltage of the first MOS transistor to above a source voltage of the first MOS transistor; and the second amplifier may further comprise a second voltage shift device configured to raise a body voltage of the second MOS transistor above a source voltage of the second MOS transistor.

The first voltage shift device may comprise a first diode and the second voltage shift device may comprise a second diode.

The first amplifier may further comprise a first cascode device coupled between the drain of the first MOS transistor and an input to the first current amplifier, and the second amplifier may further comprise a second cascode device coupled between the drain of the second MOS transistor and an input to the second current amplifier.

The first cascode device may comprise a MOS transistor with a gate coupled to the first input, and the second cascode device may comprise a further MOS transistor with a gate coupled to the second input.

The first MOS transistor may be a PMOS transistor and the second MOS transistor may be a PMOS transistor. A bottom end of a range of allowable input voltages may go below the lowest voltage supply to the first stage of the instrumentation amplifier.

The first MOS transistor may be an NMOS transistor and the second MOS transistor may be an NMOS transistor. A top end of a range of allowable input voltages may go above the highest voltage supply to the first stage of the instrumentation amplifier.

In a section aspect of the disclosure, there is provided an instrumentation amplifier comprising: a differential input; a differential output; a first amplifier comprising: a first MOS transistor, wherein a gate terminal of the first MOS transistor is coupled to a first input of the differential input, and a first feedback current amplifier coupling a drain terminal of the first MOS transistor to a source terminal of the first MOS transistor and a first output of the differential output; a second amplifier comprising: a second MOS transistor, wherein a gate terminal of the second MOS transistor is coupled to a second input of the differential input, and a second current feedback amplifier coupling a drain terminal of the second MOS transistor to a source terminal of the second MOS transistor and a second output of the differential output.

The instrumentation amplifier may further comprise: a resistor network comprising: a first feedback resistor coupling an output of the first current feedback amplifier to the source terminal of the first MOS transistor; and a second feedback resistor coupling an output of the second current feedback amplifier to output to the source terminal of the second MOS transistor.

The resistor network may further comprise a connecting resistor coupling the source terminal of the first MOS transistor to the source terminal of the second MOS transistor.

The first amplifier may further comprise a first voltage shift device configured to raise a body voltage of the first MOS transistor to above a source voltage of the first MOS transistor; and the second amplifier may further comprise a second voltage shift device configured to raise a body voltage of the second MOS transistor above a source voltage of the second MOS transistor.

The first voltage shift device may comprise a first diode and the second voltage shift device may comprise a second diode.

The first amplifier may further comprise a first cascode device coupled between the drain terminal of the first MOS transistor and an input to the first current amplifier, and wherein the second amplifier may further comprise a second cascode device coupled between the drain terminal of the second MOS transistor and an input to the second current amplifier.

The first cascode device may comprise a MOS transistor with a gate terminal coupled to the first input of the differential input, and the second cascode device may comprise a further MOS transistor with a gate terminal coupled to the second input.

In a third aspect of the present disclosure, there is provided an energy measurement frontend IC comprising an instrumentation amplifier for coupling to a current sensor to amplify a current sensor signal, the instrumentation amplifier comprising: a first amplifier comprising: a first MOS transistor, wherein a gate of the first MOS transistor is coupled to a first input of the differential input, and a first current amplifier coupling a drain of the first MOS transistor to a first output of the differential output; a second amplifier comprising: a second MOS transistor, wherein a gate of the second MOS transistor is coupled to a second input of the differential input, and a second current amplifier coupling a drain of the second MOS transistor to a second output of the differential output; and a resistor network comprising: a first feedback resistor coupling the first output to a source of the first MOS transistor; a second feedback resistor coupling the second output to a source of the second MOS transistor; and a connecting resistor coupling the source of the first MOS transistor to the source of the second MOS transistor.

The first amplifier may further comprise a first voltage shift device configured to raise a body voltage of the first MOS transistor to above a source voltage of the first MOS transistor; and the second amplifier may further comprise a second voltage shift device configured to raise a body voltage of the second MOS transistor above a source voltage of the second MOS transistor.

The first amplifier may further comprise a first cascode device coupled between the drain of the first MOS transistor and an input to the first current amplifier, and the second amplifier may further comprise a second cascode device coupled between the drain of the second MOS transistor and an input to the second current amplifier.

DRAWINGS

The present disclosure is described, by way of example only, with reference to the following drawings.

DESCRIPTION

Figure 1:
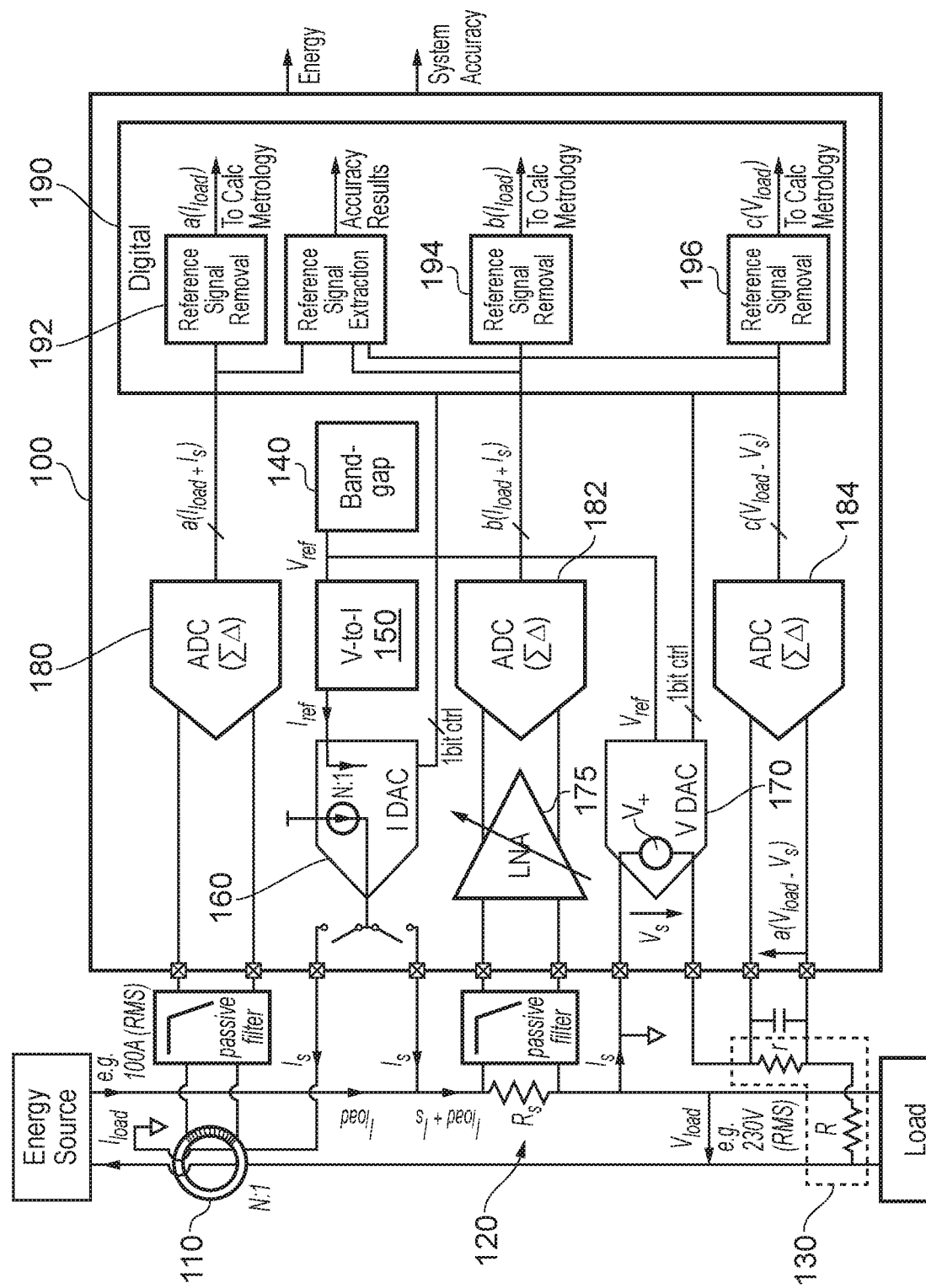
FIG. 1 shows an example system configured for monitoring of the accuracy of a utility electricity meter.

This disclosure relates particularly to a first stage of an instrumentation amplifier. The first stage of an instrumentation amplifier typically comprises two front end amplifiers, one for each input signal. The inventors have devised an implementation of these front end amplifiers where each amplifier has an input transistor for receiving an input signal to the front end amplifier and a current amplifier for amplifying an error current from the input transistor and feeding it back to the output of the front end amplifier. By virtue of this arrangement, the input transistor may be used for both signal input and feedback for the front end amplifier, thereby reducing the number of transistors and improving the noise performance of the instrumentation amplifier.

Furthermore, the arrangement devised by the inventors enables the input transistor to be implemented as a p-type transistor. Consequently, the output of the front end amplifier may sit above ground by an amount equal to the voltage threshold of the transistor. As a result of this, the instrumentation amplifier may operate with input signals that are close to ground, or even below ground, without requiring the provision of input buffers with negative voltage supplies. Thus, the instrumentation amplifier may be used to amplify very small, or even negative, signals without requiring a negative supply, thereby reducing the cost and complexity of the instrumentation amplifier.

This application presents a complete energy measurement frontend device with integrated background accuracy monitoring (Condition Based Monitoring CbM) of the full system including the sensors. This device can continuously monitor the accuracy of the energy measurement function, over the lifetime of the product, without interruption to the act of measurement. It includes monitoring of the sensors (for example, current sensors) in the system, external to the IC, which are typically the largest source of error and drift in accuracy.

This accuracy monitoring may be achieved by injection of a small signal, with known amplitude, phase, and frequency characteristics, by the measurement frontend into the sensor during the act of normal current and voltage measurement, and the presence and measurement of this signal is used to determine the accuracy of the full signal chain including the gain of the sensors in the background.

Realising this technology involves three main challenges: first, the creation of a highly stable and accurate reference signal, both voltage and current, and developing a means to drive this reference as a deterministic signal into the sensors in a stable and accurate way; second, by overcoming the large dynamic range challenges of stimulating, detecting and accurately measuring the reference stimulation signal from load, where the load current and voltage may be 100s of Amps or 100s of Volts, and the stimuli signal may be in the order of 10s of mA, and 100s of mV (due to practical signal levels possible from CMOS and the local supply); and third, by digital signal processing and signal phase and frequency automatic selection and adjustment to be able to stimulate, extract and remove this signal accurately. This application describes circuit techniques developed in overcoming the first two challenges, and will only explain the high-level requirements of the third, as it is more related to signal processing rather than circuits.

FIG. 1 shows a system 100 (for example, a measurement frontend of an electric meter) configured for monitoring of the accuracy of sensors (a current transformer (CT) 110, a shunt resistor 120 and a voltage sensor 130) and the measurement components/modules. The system 100 may be implemented as an integrated circuit, or in any other suitable way. In this implementation, the frontend is designed to measure voltage using the voltage sensor 130 comprising a potential divider R and r, phase current using the shunt resistor 120 (having a resistance Rs), and neutral return current using the CT 130, as it typical is single-phase metering devices. The phase current and voltage are used for energy accumulation, while the neutral current is used for detection of failure or lost current in the system or potential theft of electricity.

The system 100 comprises reference signal stimulators that are attached to the individual sensors. The reference signal stimulators comprise a band-gap voltage reference 140, a voltage to current converter 150, a current DAC 160 and a voltage DAC 170 and are configured, in combination with a control signal ('1 bit ctrl', output from a digital signal processor, DSP 190), to inject of a small reference signal, with known amplitude, phase, and frequency characteristics, during the act of normal current and voltage measurement, which can then be used to determine the accuracy of the full signal measurement chain including the gain of the sensors in the background. In the case of all the sensors, the reference signal travels through the exact same signal path as the load signal the system is trying to measure, and the reference signal is of the same type of signal as the load signal of interest. In the case of the current sensors 110 and 120, the reference signal is a current ($I_s$), and in the case of the voltage divider, the reference signal is a voltage ($V_s$).

The system 110 also comprises a measurement frontend, comprising ADCs 180, 182 and 184 (all sigma-delta ADCs in this example, although any other suitable type of ADC may be used). When looking at the input of the measurement frontend, the signal seen by each channel is a combination of the load signal of interest ($I_{load}$ or $V_{load}$) and the reference signal ($I_s$ or $V_s$) which is created by the system 100 itself to learn the characteristics of the sensors. The reference signals are then detected in the digital domain by the DSP 190, and removed using the reference signal removal modules/blocks 192, 194 and 196 from the signal chain before the ADC data is forwarded for the main metrology function in the system (i.e. signals a($I_{load}$), b($I_{load}$) and c($V_{load}$) are forwarded for metrology calculation elsewhere in the DSP 190 or system 100.

In this system 100, the load current $I_{load}$ can have a full scale up to about 100 A RMS, and the typical line voltage be around 230V RMS, while the stimulation signal may be at, for example, 16 mA for the current channels and 100 mV for the voltage channel. In this case, it may be desirable to extract the signal to within about 0.1% (137 dB for current and 106 dB for voltage)). The huge dynamic range difference between these signals, places the stimulation signal in the noise floor of the measurement circuitry. The stimulation signals in this example are dual level signals, with variable frequency and phase, adjusted by the digital system, with well controlled transitions between the high and low levels. The digital system 190 may automatically adjust these parameters depending on the environment on the line, meaning in effect the stimulation signal drivers are 1-bit current in-and-out or voltage in-and-out DACs. It may be desirable to maintain the fidelity and stability of the signal through this chain through the lifetime of the product, the bandgap voltage stability, the V-to-I transimpedance stability, and the driver circuits gain stability while driving various signal patterns, throughout the lifetime of the product.

Figure 2:
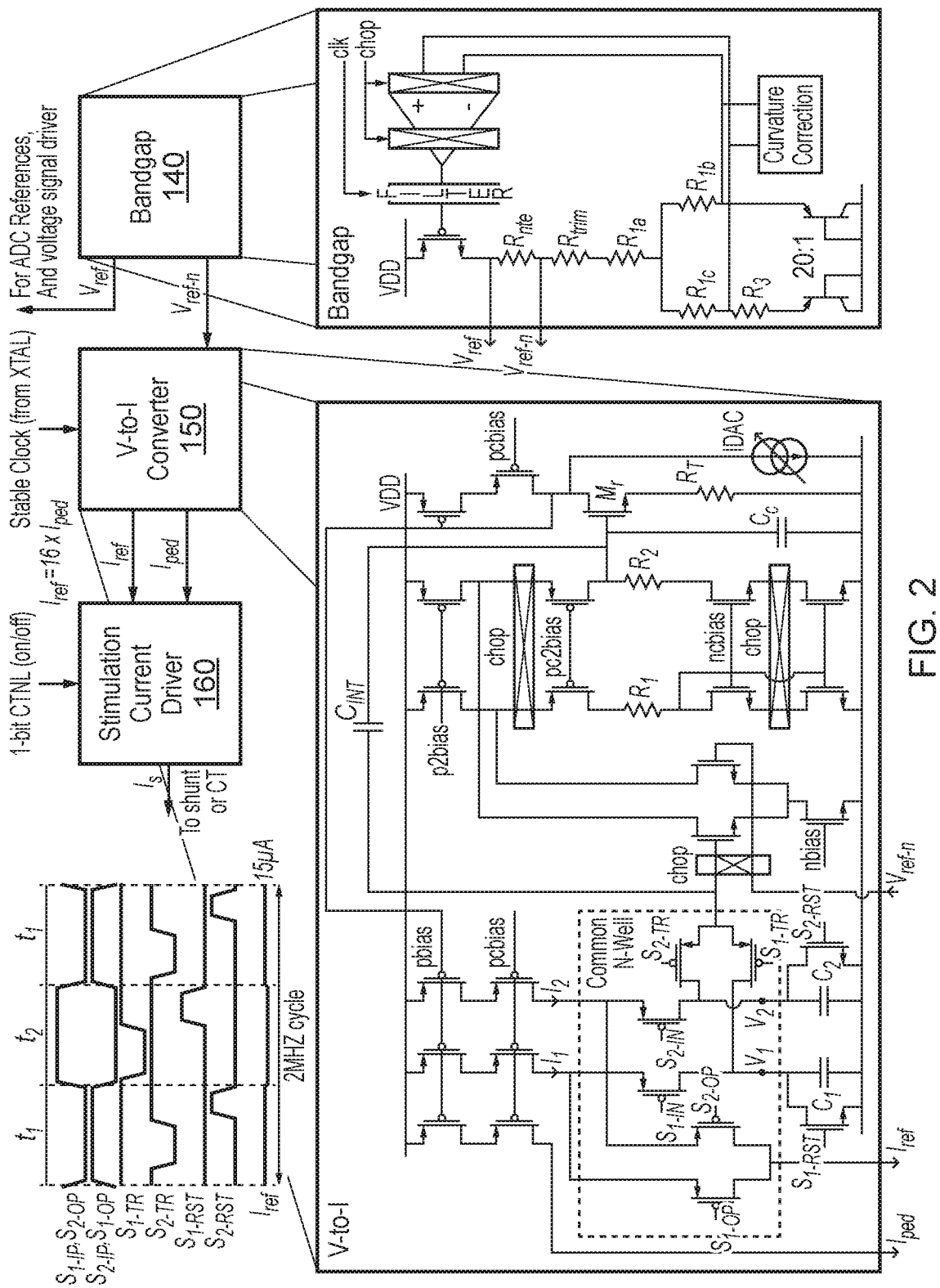
FIG. 2 shows a schematic diagram of an example V-to-I converter.

FIG. 2 shows example details of the signal chain used for the stimulation signal to drive the current sensors. First, a stable reference voltage is created using the bandgap 140. This particular bandgap comprises a chopped substrate PNP bandgap reference with the addition of an additional tap-off voltage, $V_{ref-n}$, although any suitable type of voltage reference circuit may alternatively be used. This voltage is then converted to a stable 15 uA current reference using the V-to-I circuit 150. Whilst a particular V-to-I circuit 150 devised by the inventor of the present disclosure has been represented in this example, the V-to-I circuit 150 is not the subject of the present application and any suitable V-to-I circuit may alternatively be used. Finally, this current is modulated and amplified to up to ~30 mA stimuli via a current driver 160. Any suitable circuit well understood by the skilled person may be used to implement the current driver 160.

The example bandgap 140 represented in FIG. 2 contains curvature correction, chopping and filtering, and has two outputs above the trim ($R_{trim}$) resistor, one ($V_{ref}$) with a flat TC to drive the ADC and Voltage drivers and one ($V_{ref-n}$) with a small negative temp coefficient to match the positive temperature coefficient of the capacitors used in the next stage. Many other topologies of bandgap could alternatively be used.

Turning briefly to the example implementation of the V-to-I converter 150, as a stable external crystal reference clock is available in this system 100, a reference clock of, for example ~2 MHz, is used to alternately charge two 7 pF metal-metal capacitors, $C_1$ and $C_2$, via currents $I_1$ and $I_2$, ($S_{1-IP}$, $S_{2-IP}$) and then discharge ($S_{1-RST}$, $S_{2-RST}$) them in the opposite phase when the same currents are used for the output ($S_{1-OP}$, $S_{2-OP}$). In between charging and discharging each capacitor is transferred ($S_{1-TR}$, $S_{2-TR}$) to the integrator ($C_{INT}$), this allows error integration of the difference in charge from the final voltage the capacitors finish at versus the desired $V_{ref-n}$ voltage at the input of the chopped folded cascode amplifier, whose output drives a degenerated NMOS transconductor that provides the error top-up (~20%) current to the resistor derived DAC (~80%) current. The DAC is set at manufacturing to be close to the optimum balance point of the output of the integrator, so that the residual input referred error is minimal. The loop ensures that the average (I1/2+I2/2) current charging successively each capacitor to $V_{ref-n}$ is what defines the reference current and the ping-pong operation (i.e., the alternate switching between the first current $I_1$ and the second current $I_2$) ensures the output current is directly from the same current sources used for charging the caps and doesn't involve any mirroring, in contrast to the circuit disclosed in the paper "Tracking switched-capacitor CMOS current reference", G. Torelli and A. de la Plaza, IEE Proc.-Circuits Devices Syst., Vol. 145, No. 1, February 1998, pages 44-47. This choice may enable a very cost effective stable current without the need for high performance process options for super stable resistors or transistors. Now that a reference current signal is created by the V-to-I circuit 150, this signal may be driven out into the shunt 120 and CT 110 using the reference signal driver 160.

Figure 3:
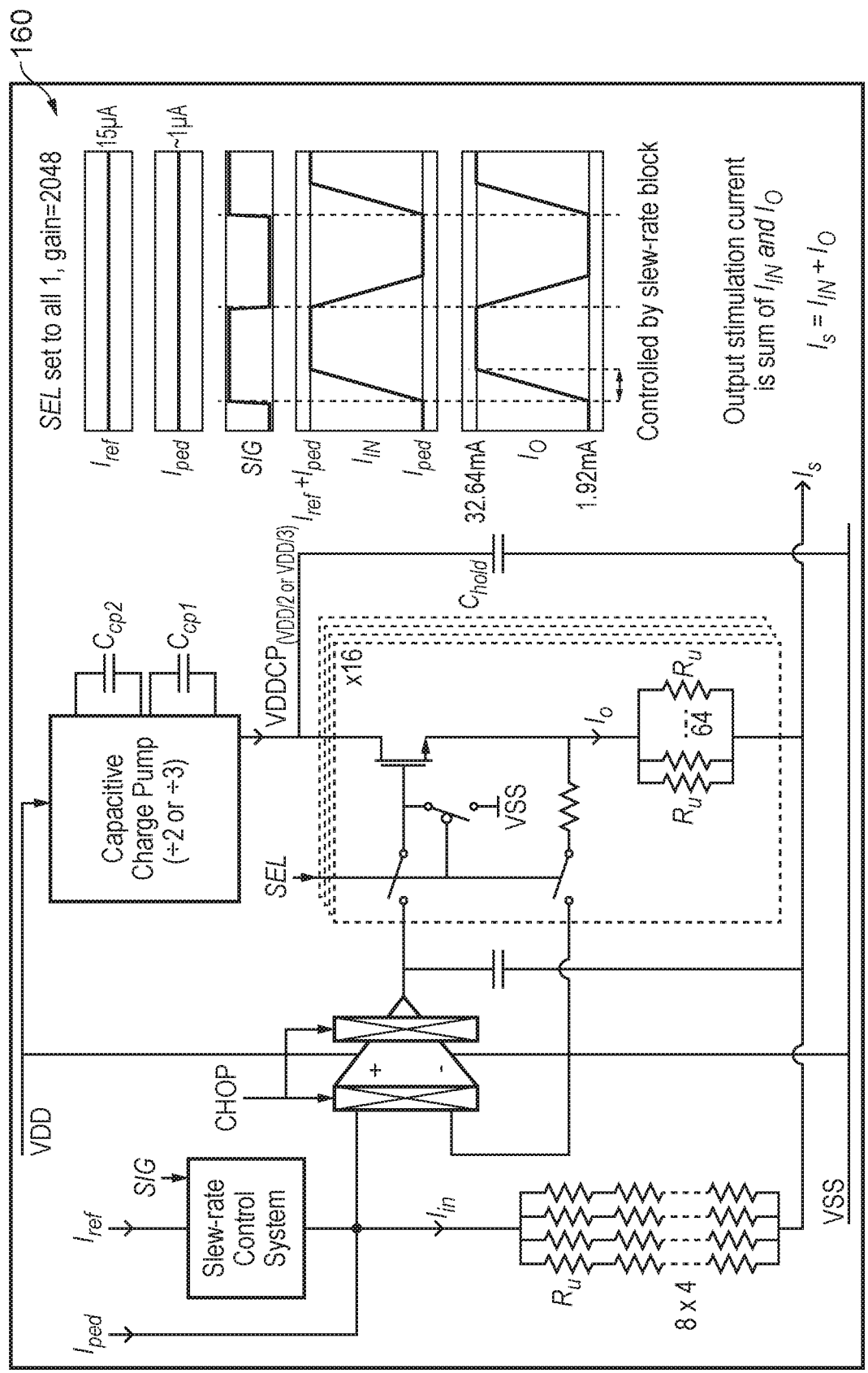
FIG. 3 shows a schematic diagram of an example current reference signal driver circuit.

FIG. 3 shows an example implementation of a current reference signal driver circuit that may optionally be used to convert the reference current into a signal, performing a similar function to the I DAC 160. However, it will be appreciated that the V-to-I conversion system 150 of the present disclosure is suitable for use for any other purpose. In this instance, the output signal are dual level signals, in the frequency range of 10s of Hz to 1 kHz, with adjustable slope rate. The circuit may attempt to deliver the largest output current level possible, while consuming the least amount of power. The actual power delivery needs are quite small, due to the low impedance of the sensors. The compliance needs of the output stage compliance may be set by the signal swing on the sensor which can move positive or negative with $I_{load}$, and the headroom needed by the driver to stably amplify and deliver the modulated current. Hence, in this example, a split supply topology is deployed, in which the reference signal creation and frontend driver operate off a 1.8V supply, but a lower supply is created efficiently using a capacitive charge pump to deliver the larger current on the output of the driver following amplification.

The driver is a current multiplier based on a resistively defined chopped opamp current copier, that outputs through a common node that attaches to the sensor. There is an input resistor that takes an input current $I_{in}$ to generate a voltage $V_{in}$ above the voltage of the output, and an amplifier that drives the control terminal (the gate) of an NMOS to ensure that the voltage on the output resistor above the common node of the output is also at $V_{in}$. The ratio of the two resistors defines the current multiplication. To achieve, for example, 30 mA peak output from a 15 uA input requires a very large ratio of about 2000:1. This may be built up carefully, firstly with 16 legs to the output path each having 64 unit resistors in parallel, and secondly with an arrangement of 4 parallel legs of 8 series unit resistors on the input, that are equivalent to 2 unit resistors but evenly distributed throughout the array, giving a ratio of 2*16*64=2048. The legs of the output can be switched off to give different ratios for different applications.

The $I_{in}$ to the current amplifier is a combination of a modulated very stable $I_{ref}$ and a pedestal current $I_{ped}$ (~$I_{ref}$/16), which may be there to ensure the input and output of the current amplifier are operating well and have some mVs and mAs, when the $I_{ref}$ is modulated to zero. The modulation may be achieved through a slew-rate control circuit that linearly controls the slew-rate so that a large di/dt is not generated that could cause EMI issues.

For the current measurement path (eg, ADC 180 and ADC 182), the small shunt input (typically about 140 μΩ) presents the most challenging signal path due to the magnitude of the signal from the sensors 110 and 120, the dynamic range challenges introduced by the relative magnitude of the reference current signal versus the load current signal, and the common-mode rejection requirements.

Figure 4:
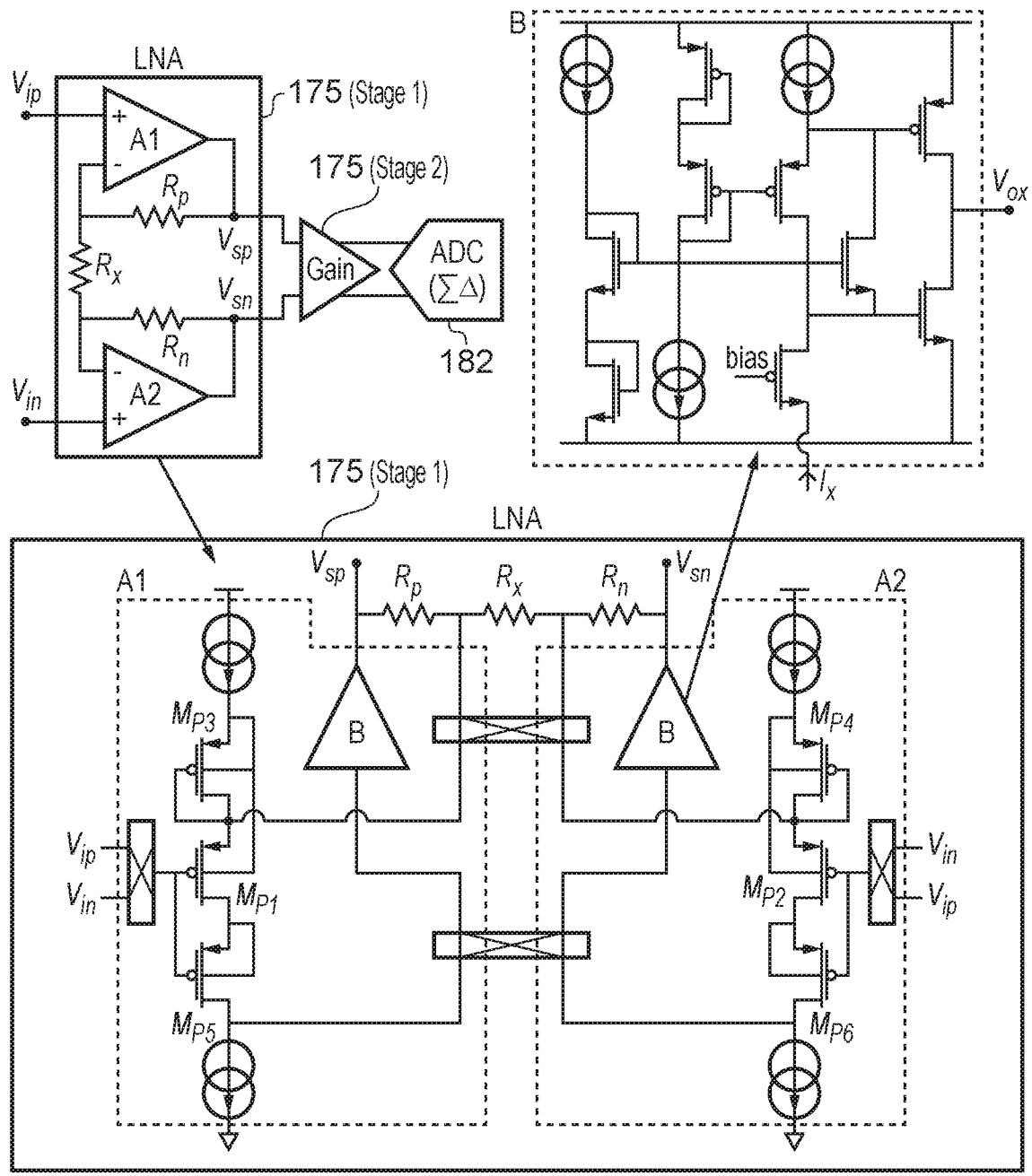
FIG. 4 shows a schematic diagram of an example implementation of a current feedback amplifier in accordance with an aspect of the present disclosure.

FIG. 4 shows an example representation of a low-noise high-impedance input, programmable current feedback instrumentation amplifier 175 (LNA) devised by the inventor in accordance with an aspect of the present disclosure, which may be used to amplify and drive the ADC 182. Whilst this current feedback amplifier 175 is described herein in relation to a particular implementation of a utility meter accuracy monitoring system 100, it will be appreciated that it may be used in any amplification context, particularly when the inputs to the amplifier are biased near ground, so the amplifier must deal with close to ground, or below-ground, signals, and/or where a single programmable gain amplifier is required to achieve high SNR for a small signal.

The first stage has an unusual input stage for each amplifier (A1 and A2) to allow them to work well below ground and to utilise a single PMOS device to be both input (gate) and feedback (source) path, creating a current efficient solution for noise that can work, for example, about 150 mV below GND on a single supply. A switched capacitor input topology may be used for RF immunity requirements of the application. The input devices $MP_{1/2}$ may be in their own well, which is biased through $MP_{3/4}$ to be a $V_{gs}$ above the source to increase the $V_t$ of the input device to provide headroom to work below ground, and which then also allows the cascode device $MP_{5/6}$ to be driven by the same control terminal (gate) voltage as $MP_{1/2}$, while allowing the drain current to be folded to a push-pull output stage (B) which provides the current to the output stage which feeds back via the resistive network ($R_p/R_x/R_n$) to the input stage $MP_{1/2}$. The bodies of $MP_{1-6}$ track the input, and the feedback network maintains constant current through the input stage, helping THD and allowing the output to sit at an elevated $V_t$ above the input signal without the need for a common mode feedback (CMFB) circuit. The amplifier output in this example is chopped, and may be filtered and buffered (stage 2) enroute to the ADC.

More general principles and arrangements of current feedback amplifiers in accordance with the present disclosure may be appreciated from FIGS. 7-10, which are now described in more detail.

Figure 7:
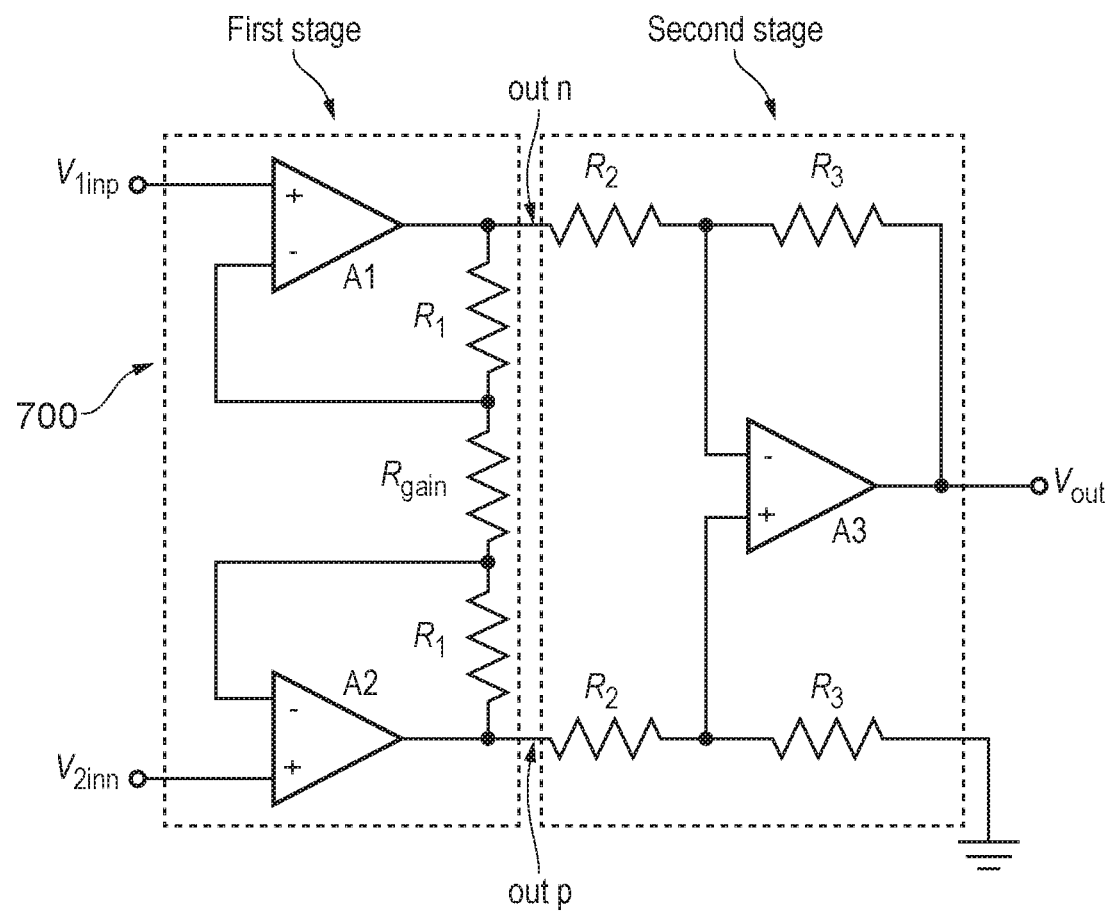
FIG. 7 shows an example representation of an instrumentation amplifier.

FIG. 7 shows an example representation of a traditional instrumentation amplifier 700, which comprises a first stage 710 and a second stage 720. The benefit of the traditional instrumentation amplifier 700 is a high input impedance. However, disadvantages include the need for three full amplifiers A1, A2 and A3. Each of these full amplifiers requires a differential pair, and current in each transistor in the pair of the first two amplifiers A1 and A2 contributes significant noise to the instrumentation amplifier. Furthermore, for the traditional instrumentation amplifier to work below GND, input buffers are needed to drive the inverting terminals below GND with their outputs, which needs a negative supply. Providing a negative supply increases costs, requires an additional IC pin and increases circuit complexity. The instrumentation amplifier of the present disclosure, which is describe above with reference to FIG. 4, and below with reference to FIGS. 8 and 9, has been devised by the inventor to address these disadvantages.

Figure 8:
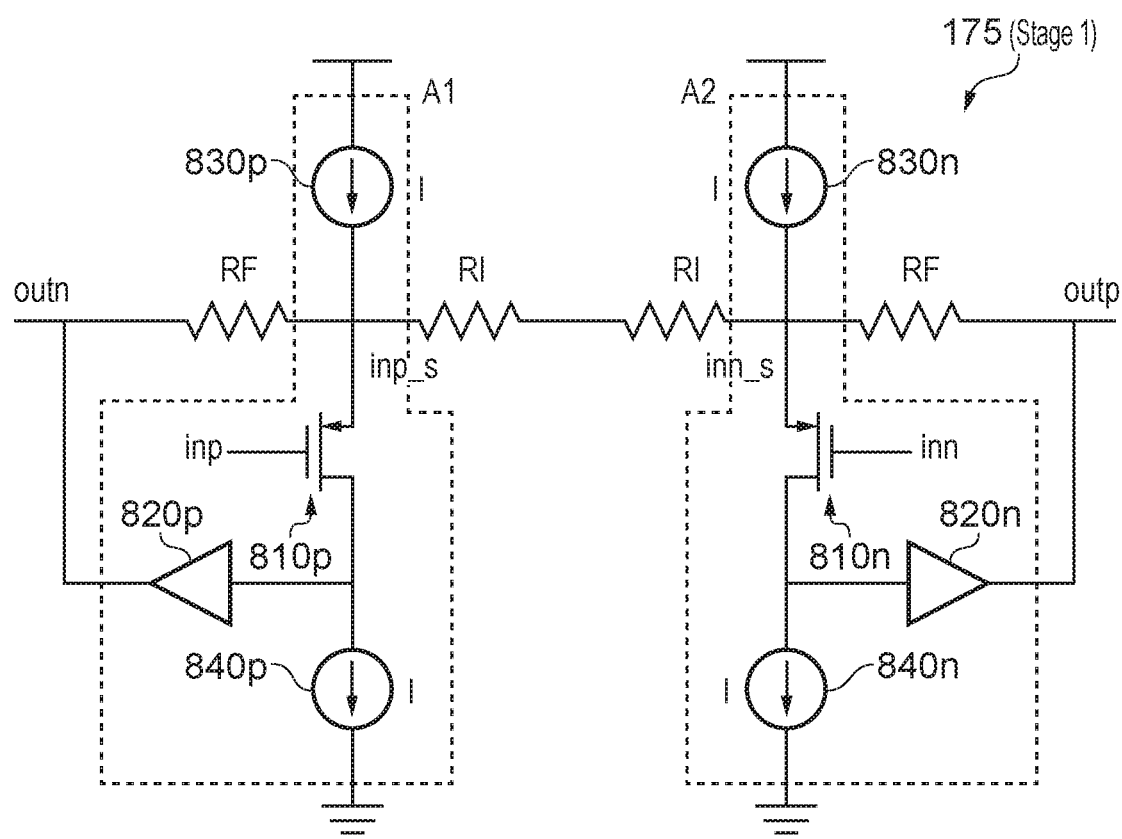
FIG. 8 shows details of a first stage of an instrumentation amplifier in accordance with an aspect of the present disclosure.

FIG. 8 shows details of the first stage of the instrumentation amplifier 175 (stage1), and particularly to A1 and A2 of the first stage of the instrumentation amplifier 175 (stage 1), in accordance with the present disclosure. The first amplifier A1 comprises a first input inp to the control terminal (gate) of the first MOS transistor 810p (in this implementation a PMOS transistor in order to work below GND). The first amplifier A1 comprises a current amplifier 820p to amplify the error current at the drain output of the first MOS transistor 810p in order to generate the output outn of the first amplifier A1. The output outn is feedback to the source of the first MOS transistor 810p via the first feedback resistor RF and the first feedback input inp_s. The first amplifier A1 may also comprise a pull up current source 830p coupled to the source of the first MOS transistor 810p and a pull down current source 840p coupled to the drain of the first MOS transistor 810p. The current sources 830p and 830n may be implemented using any suitable current source circuits. The second amplifier A2 is similarly configured, with a second input inn, a second MOS transistor 810n, a second current amplifier 820n, a second pull up current source 830n, a second pull down current source 840n and a second output outp. The output outp is feedback to the source of the second MOS transistor 810n via the second feedback resistor RF and the second feedback input inn_s. The first feedback input inp_s to the source of the first MOS transistor 810p and the second feedback input inn_s to the source of the second MOS transistor 810n are coupled to each other via connecting resistors RI (which may be implemented as a single resistor, or as two or more separate resistors). The gain of the first stage of the instrumentation amplifier 175 (stage1) is equal to 1+RF/RI. The resistor network may comprise further resistors and multiple different gain configurations could be selected by switches.

By implementing A1 and A2 in this way, a single input MOS transistor 810p can be used for both signal input and feedback for each amplifier A1. Furthermore, if the input MOS transistors 810 are PMOS type, when inp is at GND, the output level of outn is above GND by an amount equal to the voltage threshold of the first MOS transistor 810p. Likewise, when inn is at GND, the output level of outp is above GND by an amount equal to the voltage threshold of the second MOS transistor 810n. Thus, the instrumentation amplifier may work below GND without requiring a negative supply.

The second stage of the instrumentation amplifier 175 (second stage) may be implemented in any suitable way that would be well understood by the skilled person, for example as represented in FIG. 7.

Figure 9:
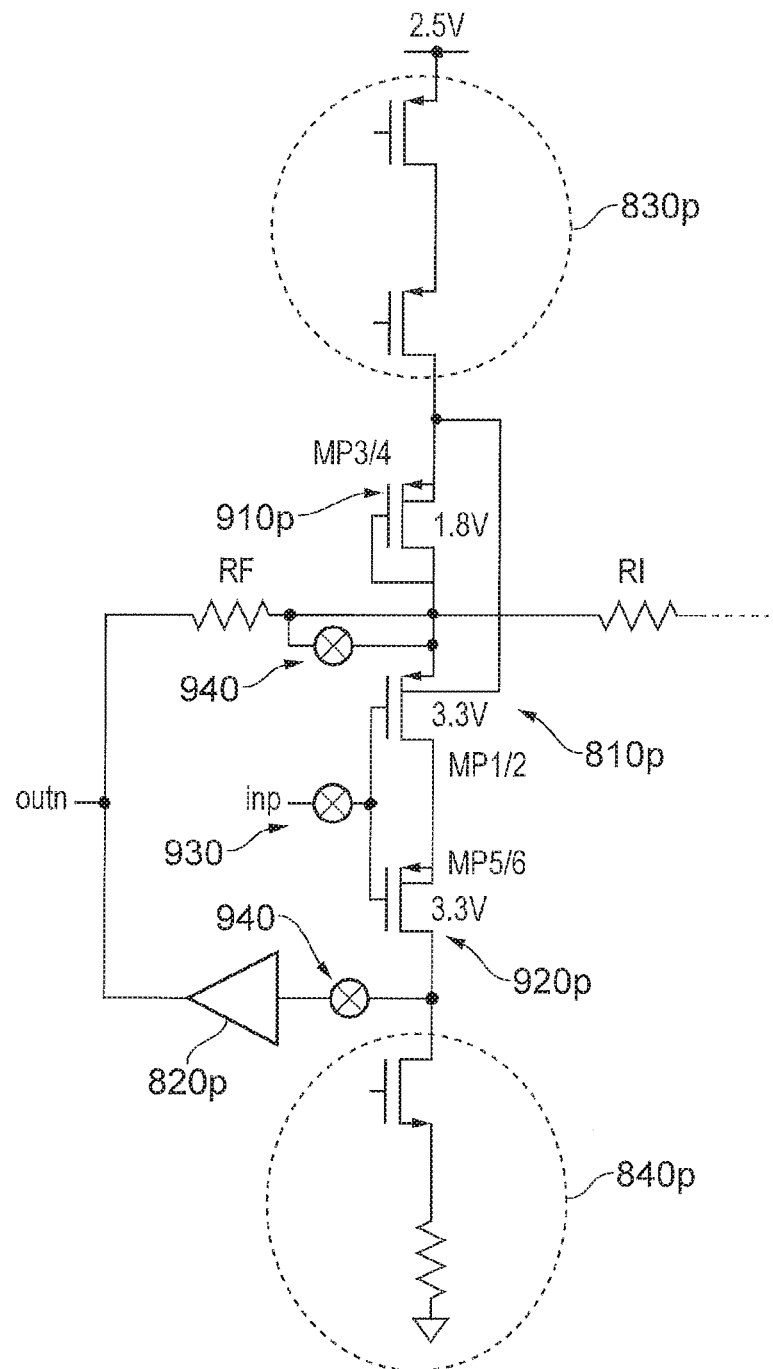
FIG. 9 shows details of a first stage of an instrumentation amplifier in accordance with a further aspect of the present disclosure.

FIG. 9 shows an implementation of part of the first stage of the instrumentation amplifier in accordance with a further aspect of the present disclosure. This implementation is similar to that of FIG. 8, but includes some optional additional features for the amplifiers A1 and A2 in accordance with the present disclosure. Only A1 is represented for simplicity, but the skilled person will readily appreciate how to implement the other amplifier A2 in order to implement an instrumentation amplifier in accordance with the present disclosure. In this implementation, a PMOS diode is utilised (which corresponds to device $MP_{3/4}$ represented in FIG. 4) as a voltage shift device 910p although it will be appreciated that in an alternative this device maybe implemented in any other suitable way, for example using a diode of any other configuration, or using a resistor, etc. The effect of this voltage shift device 910p is to act as a "floating battery", adding a fixed body-effect shift to the threshold voltage of the main input PMOS 810p (which corresponds to device $MP_{1/2}$ represented in FIG. 4). This even further raises the output at outp, allowing even further headroom for below GND voltages at inp. There are many alternatives to the voltage shift device 910p comprising a series diode to shift the body voltage of the input MOS transistor 810p to higher than the source of the input MOS transistor 810p. For example, a parallel approach may alternatively be used to create the body bias, for example a switched capacitor circuit could charge pump a holding capacitor between the input and the body, such that its voltage is greater than the gate-source voltage to achieve a similar effect. There are several other parallel or series voltage shift device/circuit techniques to generate the body bias, where a criteria for the voltage shift circuit/device may be that it drives the body of the input MOS device 810p to be different to the source of the input MOS device 810p, but keeps it largely tracking the input to the MOS device 810p control terminal (gate), so that the body effect it induces does not significantly change when the voltage of the control terminal (the gate voltage) moves with the input signal.

A further additional or alternative feature is a cascode transistor 920p (which corresponds to device $MP_{5/6}$ represented in FIG. 4) between the drain of 810p and the current amplifier 820p. The cascode transistor 920p tracks the input inp as well as the main input PMOS 810p, so that the instrumentation amplifier 175 can run with constant Vt and current even with the control terminal (gate) of the main input MOS transistor 810p below GND. This may be made possible in the configuration shown here by having this cascode device 920p in its own body connected to its source, so that its Vt does not have the body effect that the input MOS device 810p has, as this means that there is a voltage difference between drain and source of the input MOS device 810p so that it is kept in saturation. Whilst the cascode transistor 920p used in FIG. 9 is a MOS transistor, it will be appreciated that any other suitable type of transistor may alternatively be used.

In the implementation represented in FIG. 9, there are also optional chopping switches, including an input chopping switch 930 at the input to the first stage of the instrumentation amplifier and feedback chopping switches in the feedback loop. The skilled person will appreciate how to implement the chopping switches 930 and 940 to achieve the functionality of chopping the amplified signal between the two halves of the first stage of the instrumentation amplifier, to correct for any mismatch between the two halves (for example, mismatch in the performance of the transistors on either side and/or the current amplifiers on either side). As explained earlier, the input inp may be below ground, so the input chopping switch 930 may be configured to handle below-ground inputs. The configuration of the optional chopping switches 930 and 940 is not the subject of the present disclosure, so no further explanation shall be given here, for the sake of brevity.

It can be appreciated that this invention could also be used for when the inputs do not go below GND, and for example that if it was needed to use the invention to process a signal that went above the power supply of the first stage 175 (Stage 1), it would be possible to 'invert' the configuration and use NMOS devices as the input MOS devices 810p and 810n and have for each NMOS device 810p and 810n the current amplifier 820p and 820n coupled to the drain and a current source 830p and 830n from the supply coupled to the source.

Optionally, to correctly track the accuracy of the energy measurement system 100, a voltage channel, which is measuring the line mains voltage at 100s volts using a high ratio (for example, 1000:1) high impedance potential divider 130 also needs monitoring. The purpose of this monitoring circuit is to track the external resistor divider ratio in the background without interruption to the act of measurement. To do this, a small voltage signal $V_s$ may be applied through the bottom end of the potential divider 130. This signal will be divided by the exact same voltage divider ratio as the mains voltage from the top due to super position, and if this signal is detected in digital and removed, can be used to estimate the divider ratio.

Figure 5:
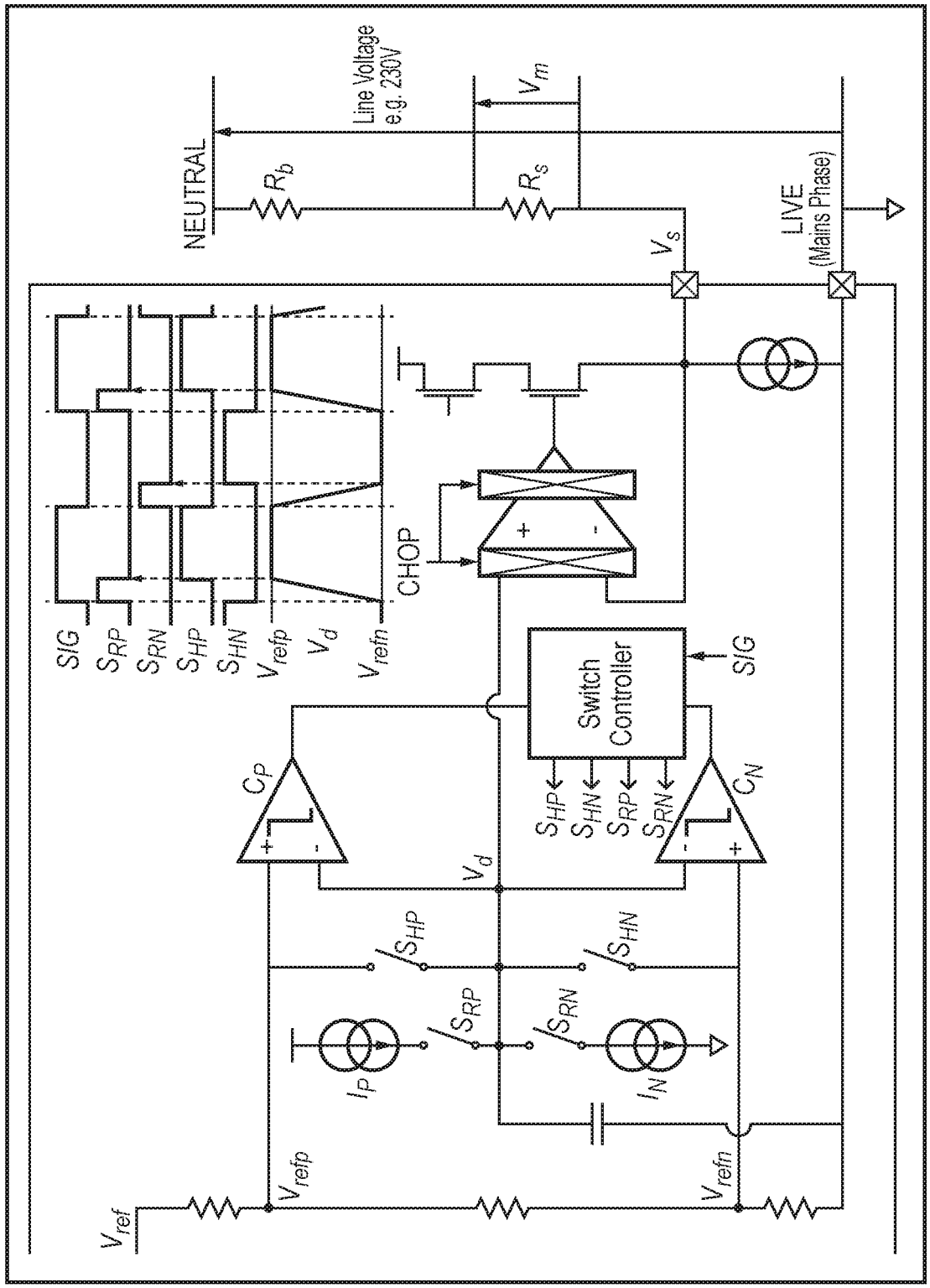
FIG. 5 shows a schematic diagram of an example circuit for tracking the external resistor divider ratio.

FIG. 5 shows this configuration and the circuit used for driving the bottom of the divider 130. The driver derives two voltages $V_{refp}$ and $V_{refn}$ from the voltage reference $V_{ref}$ and under the command of the SIG signal switches the chopper stabilised Class A buffer between the 2 levels. Class A was chosen for this particular example to ensure constant current in GND in order to minimise crosstalk mechanisms. Under control of the SIG signal on the rising edge the pull up current ($I_P$) through $S_{RP}$ to charge the cap to control the slew-rate until when comparator $C_P$ fires the target $V_{refp}$ voltage is switched in through $S_{HP}$, similarly on the falling edge of SIG the pull down current ($I_n$) is switched in to slew the driver down to the $V_{refn}$ level, when the comparator C2 fires and $S_{HN}$ switches over to that. In this way and by altering the current values the slew rate can be constant and controlled between 200 uS and 2 mS, and the handover from slew to settling of the signal has minimum impact back to the reference and to the divider. Not shown in the diagram, the amplifier may have additional low and high side protection to handle surge events on the line which may reach several 1000V.

Figure 6:
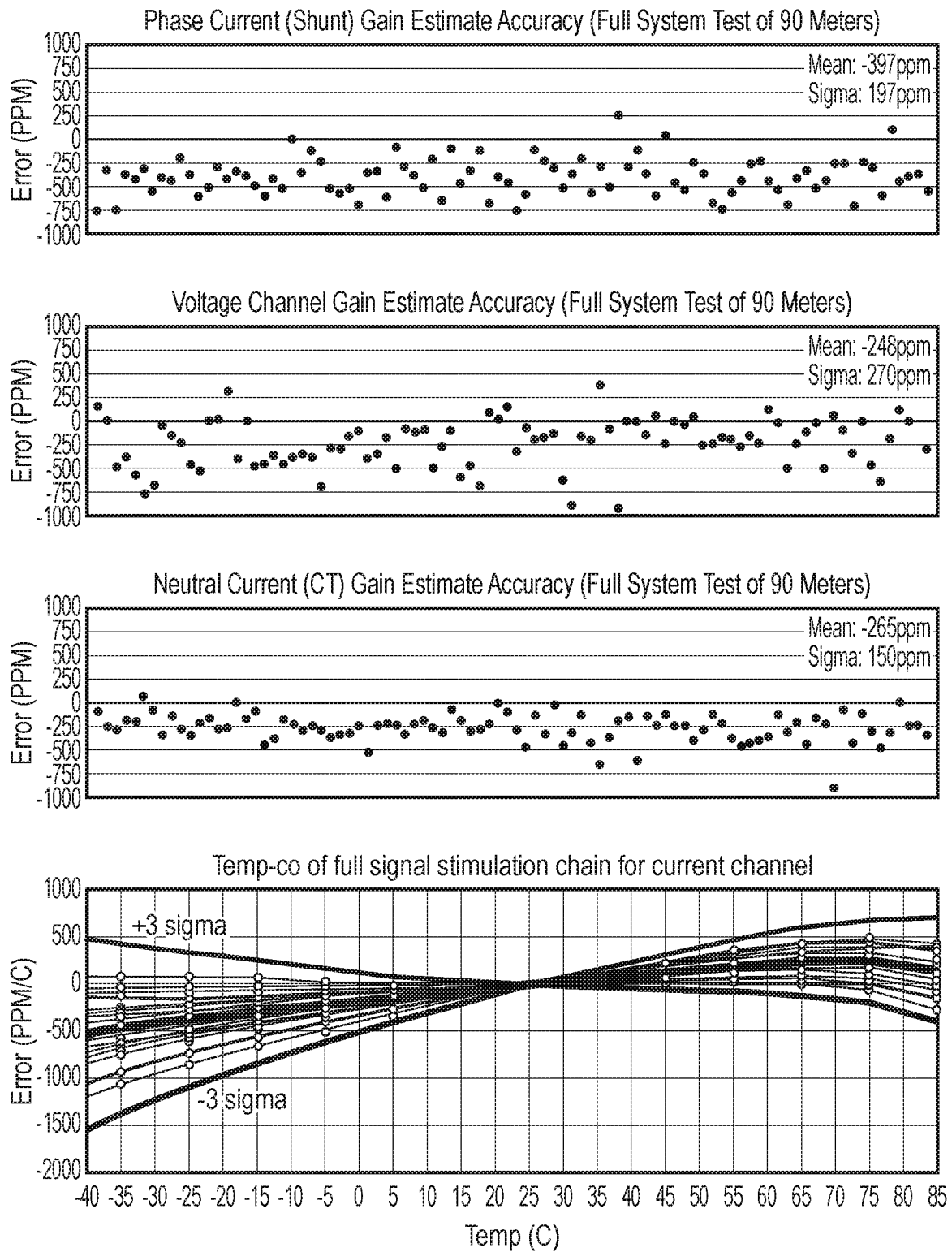
FIG. 6 shows a graphical representation of the performance of the system accuracy tracking.

The complete design including the signal processing and metrology functions may be fabricated in 0.18u standard CMOS processes, with a die area of 11.8 mm² including pads (although other suitable processes and die areas may be used). To characterise the performance of the IC at monitoring and tracking the gain of the current and voltage channels including the sensors, the silicon may be integrated in a complete measurement system, an electricity meter, for characterisation. 90 instances of these electricity meters were tested, for the performance of the system accuracy tracking, and the results are shown in FIG. 6. Here for each meter the quality of the ICs ability to estimate the accuracy of the Phase current, Neutral current, and voltage measurement are plotted, and the IC is able to detect the measurement accuracy to better than 0.1% for all channel. This testing was done at room temperature, with different background load signal levels. In addition, the reference stimulation signal, used for gain estimation, changes with temperature which also limits the system's ability to estimate the accuracy of the measurement path. FIG. 6 also shows the temp-co of the full current stimulation paths. Here the temp-co measured is dominated by the bandgap temp-co, and the voltage stimulation channels temp-co was found to match the current channel very closely. Typical electricity meters Class 1, requiring energy measurement accuracy greater than 1%. Here the combination of the error at room, with the addition of temp-co over −40 to +85° C. shows a full energy accuracy monitoring of greater than 0.5% accuracy.

The skilled person will readily appreciate that various alterations or modifications may be made to the above described aspects of the disclosure without departing from the scope of the disclosure.

Whilst the first stage of the instrumentation amplifier 175 (stage 1) described above comprises a resistor feedback network R1 and RF, or Rp, Rn and Rx, it will be appreciated that is this merely one particular example implementation of the first stage of the instrumentation amplifier 175 (stage 1). The skilled person will readily appreciate that the feedback network/coupling may alternatively be implemented in any other suitable way that is well understood in the common general knowledge.

The terminology of "coupling" used in this disclosure encompasses both direct coupling of components and also indirect coupling of components (i.e., coupling of two components with one or more other components of devices in between). For example, the drain of the main PMOS transistor 810p of the first stage of the instrumentation amplifier 175 (Stage 1) is coupled to the input of the current amplifier 810p. In FIG. 8, they are directly coupled. In FIG. 9, they are coupled to each other by the cascade device 920p. Furthermore, they may be coupled to each other by any other additional, or alternative, devices.

The claimed invention is:

1. An instrumentation amplifier comprising:
a first stage configured to generate an amplified differential output based on a differential input, the first stage including:
a first amplifier including:
a first transistor, wherein a gate of the first transistor is coupled to a first input of the differential input, and
a first current amplifier coupling a drain of the first transistor to a first output of the differential output;
a second amplifier including:
a second transistor, wherein a gate of the second transistor is coupled to a second input of the differential input, and
a second current amplifier coupling a drain of the second transistor to a second output of the differential output; and
a resistor network including:
a first feedback resistor coupling the first output to a source of the first transistor; and
a second feedback resistor coupling the second output to a source of the second transistor,
wherein the first amplifier further comprises a first cascode device coupled between the drain of the first transistor and an input to the first current amplifier, wherein the second amplifier further comprises a second cascode device coupled between the drain of the second transistor and an input to the second current amplifier, and
wherein the first cascode device comprises a transistor with a gate coupled to the first input, and wherein the second cascode device comprises a further transistor with a gate coupled to the second input.

2. The instrumentation amplifier of claim 1, wherein the resistor network further comprises:
a connecting resistor coupling the source of the first transistor to the source of the second transistor.

3. The instrumentation amplifier of claim 1, wherein:
the first amplifier further comprises a first voltage shift device configured to raise a body voltage of the first transistor to above a source voltage of the first transistor; and
the second amplifier further comprises a second voltage shift device configured to raise a body voltage of the second transistor above a source voltage of the second transistor.

4. The instrumentation amplifier of claim 3, wherein:
the first voltage shift device comprises a first diode and the second voltage shif device comprises a second diode.

5. The instrumentation amplifier of claim 1, wherein the first transistor is a p-type transistor and the second transistor is a p-type transistor.

6. The instrumentation amplifier of claim 5, wherein a bottom end of a range of allowable input voltages goes below the lowest voltage supply to the first stage of the instrumentation amplifier.

7. The instrumentation amplifier of claim 5, wherein the first transistor is an n-type transistor and the second transistor is an n-type transistor.

8. The instrumentation amplifier of claim 7, wherein a top end of a range of allowable input voltages goes above the highest voltage supply to the first stage of the instrumentation amplifier.

9. An instrumentation amplifier comprising:
a differential input;
a differential output;
a first amplifier comprising:
a first transistor, wherein a gate terminal of the first transistor is coupled to a first input of the differential input, and a first feedback current amplifier coupling a drain terminal of the first transistor to a source terminal of the first transistor and a first output of the differential output; and a second amplifier comprising:
a second transistor, wherein a gate terminal of the second transistor is coupled to a second input of the differential input, and
a second current feedback amplifier coupling a drain terminal of the second transistor to a source terminal of the second transistor and a second output of the differential output,
wherein the first amplifier further comprises a first cascade device coupled between the drain terminal of the first transistor and an input to the first current amplifier, wherein the second amplifier further comprises a second cascade device coupled between the drain terminal of the second transistor and an input to the second current amplifier, and
wherein the first cascode device comprises a transistor with a gate terminal coupled to the first input of the differential input, and wherein the second cascode device comprises a further transistor with a gate terminal coupled to the second input of the differential input.

10. The instrumentation amplifier of claim 9 further comprising:
a resistor network comprising:
a first feedback resistor coupling an output of the first current feedback amplifier to the source terminal of the first transistor; and
a second feedback resistor coupling an output of the second current feedback amplifier to output to the source terminal of the second transistor.

11. The instrumentation amplifier of claim 10, wherein the resistor network further comprises:
a connecting resistor coupling the source terminal of the first transistor to the source terminal of the second transistor.

12. The instrumentation amplifier of claim 9, wherein:
the first amplifier further comprises a first voltage shift device configured to raise a body voltage of the first transistor to above a source voltage of the first transistor; and
the second amplifier further comprises a second voltage shift device configured to raise a body voltage of the second transistor above a source voltage of the second transistor.

13. The instrumentation amplifier of claim 9 wherein:
the first voltage shift device comprises a first diode and the second voltage shift device comprises a second diode.

14. An energy measurement frontend IC comprising:
an instrumentation amplifier configured to couple to a current sensor and amplify a current sensor signal, the instrumentation amplifier including:
a first amplifier including:
a first transistor, wherein a gate of the first transistor is coupled to a first input of the differential input, and
a first current amplifier coupling a drain of the first transistor to a first output of the differential output;
a second amplifier including:
a second transistor, wherein a gate of the second transistor is coupled to a second input of the differential input, and a second current amplifier coupling a drain of the second transistor to a second output of the differential output; and
a resistor network including:
a first feedback resistor coupling the first output to a source of the first transistor;
a second feedback resistor coupling the second output to a source of the second transistor; and
a connecting resistor coupling the source of the first transistor to the source of the second transistor,
wherein the first amplifier further comprises a first cascode device coupled between the drain of the first transistor and an input to the first current amplifier, wherein the second amplifier further comprises a second cascode device coupled between the drain of the second transistor and an input to the second current amplifier, and
wherein the first cascode device comprises a transistor with a gate coupled to the first input, and wherein the second cascode device comprises a further transistor with a gate coupled to the second input.

15. The energy measurement frontend IC of claim 14, wherein:
the first amplifier further comprises a first voltage shift device configured to raise a body voltage of the first transistor to above a source voltage of the first transistor; and
the second amplifier further comprises a second voltage shift device configured to raise a body voltage of the second transistor above a source voltage of the second transistor.

16. An instrumentation amplifier comprising:
a differential input;
a differential output;
a first amplifier comprising:
a first transistor, wherein a gate terminal of the first transistor is coupled to a first input of the differential input, and
a first feedback current amplifier coupling a drain terminal of the first transistor to a source terminal of the first transistor and a first output of the differential output; and
a second amplifier comprising:
a second transistor, wherein a gate terminal of the second transistor is coupled to a second input of the differential input, and
a second current feedback amplifier coupling a drain terminal of the second transistor to a source terminal of the second transistor and a second output of the differential output,
wherein:
the first amplifier further comprises a first cascode device coupled between the drain terminal of the first transistor and an input to the first current amplifier, and wherein
the second amplifier further comprises a second cascode device coupled between the drain terminal of the second transistor and an input to the second current amplifier, and
wherein:
the first amplifier further comprises a first voltage shift device configured to raise a body, voltage of the first transistor to above a source voltage of the first transistor; and the second amplifier further comprises a second voltage shift device configured to raise a body voltage of the second transistor above a source voltage of the second transistor.

17. The instrumentation amplifier of claim 16, wherein:
the first amplifier further comprises a first cascode device coupled between the drain terminal of the first transistor and an input to the first current amplifier, and wherein
the second amplifier further comprises a second cascode device coupled between the drain terminal of the second transistor and an input to the second current amplifier.

18. The instrumentation amplifier of claim 17, wherein the first cascode device comprises a transistor with a gate terminal coupled to the first input of the differential input, and wherein the second cascode device comprises a further transistor with a gate terminal coupled to the second input.

19. An instrumentation amplifier comprising:
a first stage configured to generate an amplified differential output based on a differential input, the first stage including:
a first amplifier including:
a first transistor, wherein a gate of the first transistor is coupled to a first input of the differential input, and
a first current amplifier coupling a drain of the first transistor to a first output of the differential output;
a second amplifier including:
a second transistor, wherein a gate of the second transistor is coupled to a second input of the differential input, and
a second current amplifier coupling a drain of the second transistor to a second output of the differential output; and
a resistor network including:
a first feedback resistor coupling the first output to a source of the first transistor; and
a second feedback resistor coupling the second output to a source of the second transistor,
wherein the first amplifier further comprises a first voltage shift device configured to raise a body voltage of the first transistor to above a source voltage of the first transistor, and
wherein the second amplifier further comprises a second voltage shift device configured to raise a body voltage of the second transistor above a source voltage of the second transistor.

20. The instrumentation amplifier of claim 19, wherein:
the first amplifier further comprises a first cascode device coupled between the drain terminal of the first transistor and an input to the first current amplifier, and wherein
the second amplifier further comprises a second cascode device coupled between the drain terminal of the second transistor and an input to the second current amplifier.

21. The instrumentation amplifier of claim 20, wherein the first cascode device comprises a transistor with a gate terminal coupled to the first input of the differential input, and wherein the second cascode device comprises a further transistor with a gate terminal coupled to the second input.

* * * * *